United States Patent
Schwab et al.

(10) Patent No.: US 9,818,602 B2
(45) Date of Patent: Nov. 14, 2017

(54) METHOD OF DEPOSITING A RESIN MATERIAL ON A SEMICONDUCTOR BODY WITH AN INKJET PROCESS

(71) Applicant: Infineon Technologies Austria AG, Villach (AT)

(72) Inventors: Stefan Schwab, Vienna (AT); Markus Heinrici, Villach (AT); Rafael Janski, Villach (AT); Susanne Kraeuter, Vienna (AT); Martin Mischitz, Wernberg (AT)

(73) Assignees: Infineon Technologies AG, Neubiberg (DE); Technische Universität Graz, Graz (AT)

( * ) Notice: Subject to any disclaimer, the term of this patent is extended or adjusted under 35 U.S.C. 154(b) by 0 days.

(21) Appl. No.: 14/861,126

(22) Filed: Sep. 22, 2015

(65) Prior Publication Data
US 2016/0082718 A1    Mar. 24, 2016

(30) Foreign Application Priority Data

Sep. 23, 2014 (DE) .......................... 10 2014 113 697

(51) Int. Cl.
| | | |
|---|---|---|
| H01L 21/00 | (2006.01) | |
| H01L 23/48 | (2006.01) | |
| H01L 21/02 | (2006.01) | |
| C09J 163/00 | (2006.01) | |
| C09J 5/00 | (2006.01) | |
| H01L 21/56 | (2006.01) | |
| H01L 51/00 | (2006.01) | |
| H01L 23/31 | (2006.01) | |

(Continued)

(52) U.S. Cl.
CPC ........ *H01L 21/02288* (2013.01); *C09D 11/10* (2013.01); *C09D 11/30* (2013.01); *C09J 5/00* (2013.01); *C09J 163/00* (2013.01); *H01L 21/56* (2013.01); *H01L 23/31* (2013.01); *H01L 23/3157* (2013.01); *H01L 51/0005* (2013.01); *C09J 2463/00* (2013.01)

(58) Field of Classification Search
CPC . H01L 23/28; H01L 23/3157; H01L 23/3107; H01L 21/561; H01L 23/31; H01L 21/02288; H01L 51/0005; H01L 21/56; C09D 11/101; C09D 11/30; C09D 11/10; C09J 163/00; C09J 5/00
See application file for complete search history.

(56) References Cited

U.S. PATENT DOCUMENTS 5,187,123 A * 2/1993 Yoshida .................. H01L 24/27
                                                    156/291
5,681,757 A * 10/1997 Hayes .................. H01L 21/563
                                                    156/295

(Continued)

FOREIGN PATENT DOCUMENTS

| CN | 101447442 A | 6/2009 |
|---|---|---|
| CN | 101552216 A | 10/2009 |

(Continued)

*Primary Examiner* — Alonzo Chambliss
(74) *Attorney, Agent, or Firm* — Murphy, Bilak & Homiller, PLLC

(57) ABSTRACT

A method a described which includes depositing a first component of a multicomponent system by means of an inkjet process, and depositing a second component of the multicomponent system by means of an inkjet process.

15 Claims, 3 Drawing Sheets

(51) Int. Cl.
*C09D 11/10* (2014.01)
*C09D 11/30* (2014.01)

(56) References Cited

U.S. PATENT DOCUMENTS

| | | | | |
|---|---|---|---|---|
| 5,959,362 | A * | 9/1999 | Yoshino | H01L 21/563 257/778 |
| 6,576,500 | B2 * | 6/2003 | Furukawa | H01L 21/4864 438/115 |
| 6,878,448 | B2 * | 4/2005 | Ishii | C08G 59/245 257/E23.119 |
| 7,235,415 | B2 * | 6/2007 | Mikoshiba | B41J 2/14201 257/E21.174 |
| 7,687,319 | B2 * | 3/2010 | Nishimura | H01L 21/563 257/778 |
| 7,931,352 | B2 * | 4/2011 | Imamura | B41J 2/14024 347/44 |
| 9,352,561 | B2 * | 5/2016 | Harjee | B41J 2/07 |
| 2003/0036587 | A1 * | 2/2003 | Kozak | C08K 5/54 523/445 |
| 2004/0023439 | A1 * | 2/2004 | Kimino | H01L 21/56 438/126 |
| 2005/0017373 | A1 * | 1/2005 | Nishikawa | H05K 3/321 257/778 |
| 2008/0278534 | A1 * | 11/2008 | Kim | B41J 2/195 347/19 |
| 2009/0078785 | A1 | 3/2009 | Herminghaus | |
| 2009/0096825 | A1 * | 4/2009 | Takahashi | B41J 2/2132 347/12 |
| 2009/0236757 | A1 * | 9/2009 | Mengel | H01L 23/49513 257/783 |
| 2010/0148368 | A1 * | 6/2010 | Nishizawa | H01L 21/563 257/762 |
| 2012/0056923 | A1 * | 3/2012 | Vronsky | B41J 2/0456 347/12 |
| 2014/0312394 | A1 * | 10/2014 | Mahler | H01L 21/56 257/288 |
| 2016/0049297 | A1 * | 2/2016 | Tanikawa | H01L 24/27 438/118 |

FOREIGN PATENT DOCUMENTS

| | | |
|---|---|---|
| DE | 69928634 T2 | 8/2006 |
| DE | 102006012389 A1 | 9/2007 |
| DE | 102009004877 A1 | 7/2010 |
| EP | 1004440 A2 | 5/2000 |

* cited by examiner

METHOD OF DEPOSITING A RESIN MATERIAL ON A SEMICONDUCTOR BODY WITH AN INKJET PROCESS

PRIORITY CLAIM

This application claims priority to German Patent Application No. 10 2014 113 697.7 filed on 23 Sep. 2014, the content of said application incorporated herein by reference in its entirety.

TECHNICAL FIELD

The present invention relates to methods with inkjet processes and their application. In particular, the methods can be carried out using a multicomponent system or multicomponent adhesive. Furthermore, the invention relates to apparatuses for carrying out the methods.

BACKGROUND

Multicomponent systems and multicomponent adhesives are used in many technical areas and industrial branches. In one application of a multicomponent adhesive, for example, the components of the adhesive which are initially present separately from one another can be mixed, wherein a limited time window for further processing can be available after mixing of the components until curing of the adhesive. It can be desirable to improve the use of multicomponent systems and multicomponent adhesives and the structures which are formed from them. For this and further reasons, there is a need for the present invention.

SUMMARY

According to one aspect, a method comprises: depositing a first component of a multicomponent system by means of an inkjet process, and depositing a second component of the multicomponent system by means of an inkjet process.

According to a further aspect, a method comprises: depositing a first component of a multicomponent system and a second component of the multicomponent system by means of an inkjet process in droplet form on a first area, and mixing the droplets of the first component and the droplets of the second component by way of spreading of the droplets of the first and second components and/or by way of the first area and a second area being brought into contact.

According to a further aspect, a method comprises: applying a first component of a multicomponent system onto a first area by means of an inkjet process; applying a second component of the multicomponent system onto a second area by means of an inkjet process, and mixing the first component and the second component by way of the first area and the second area being brought into contact.

Those skilled in the art will recognize additional features and advantages upon reading the following detailed description and on viewing the accompanying drawings.

BRIEF DESCRIPTION OF THE FIGURES

A person skilled in the art will recognize further features and advantages when reading the following detailed description and considering the appended drawings.

The appended drawings are intended to contribute to the understanding of further aspects. The drawings illustrate aspects and serve to explain the fundamental concepts of said aspects together with the description. Further aspects and many of the associated advantages are to be made understandable by way of the following detailed description. The elements of the drawings are not necessarily true to scale with respect to one another. Identical reference numerals can denote similar components.

DETAILED DESCRIPTION

Figure 1:
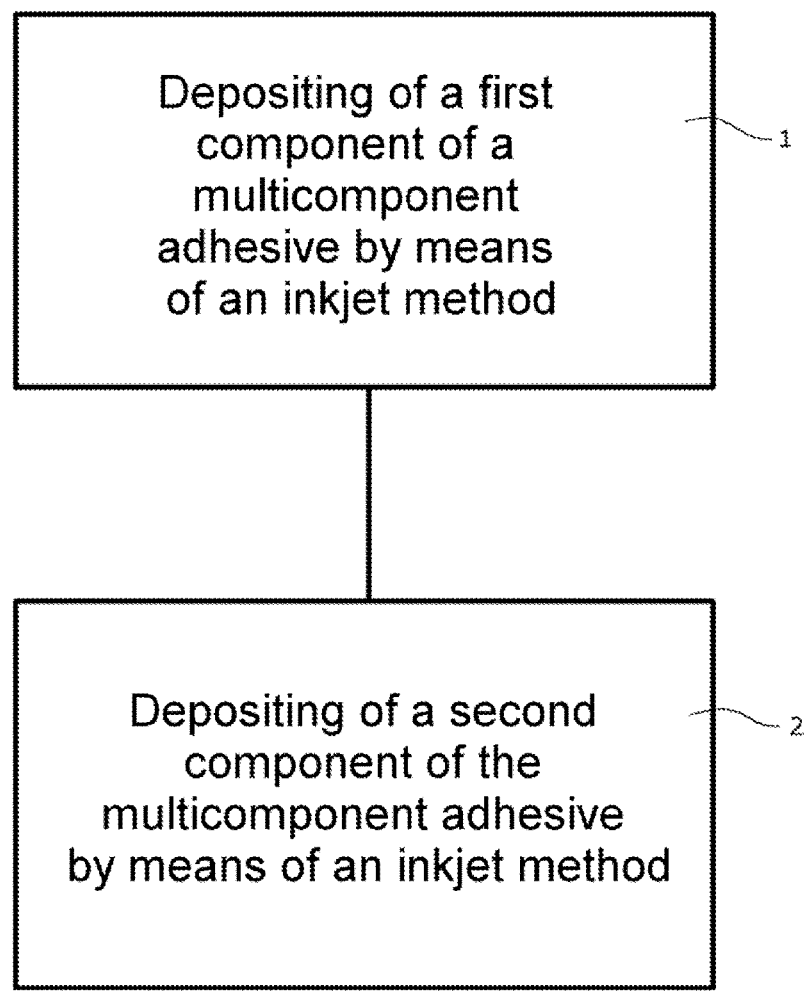
FIG. 1 shows a flow chart of an exemplary method with inkjet processes.

Reference is made in the following detailed description to the appended drawings, in which specific aspects are shown for explanatory purposes, in which specific aspects the invention can be realized. In this context, directional terminology, such as "top", "bottom", "front", "rear", etc., can be used in relation to the orientation of the described figures. Since the components of the described apparatuses can be positioned in a plurality of different orientations, the directional terminology can be used for explanatory purposes and is in no way restrictive. Other aspects can be used and structural or logical changes can be carried out, without deviating from the concept of the present disclosure. The following detailed description is therefore not to be interpreted in a restrictive sense, and the concept of the present invention is to be specified by way of the appended claims.

The expressions "connected", "coupled", "electrically connected" and/or "electrically coupled" which are possibly used in this description are not to mean that components have to be connected or coupled directly to one another. Components which lie in between can be provided between the components which are "connected", "coupled", "electrically connected" and/or "electrically coupled".

Furthermore, the word "over" which is used, for example, with regard to a material layer which is configured "over" a surface of an object or which is situated "over" a surface of an object can be used here in such a way that it means that the material layer is situated (configured, deposited, etc.) "directly on", for example in direct contact with, the implied surface. The word "over", as used, for example, with regard to a material layer which is configured "over" a surface of an object or is situated "over" a surface of an object, can be used here, moreover, in such a way that it means that the material layer is situated (for example, is configured, deposited, etc.) "indirectly on" the implied surface, one or more additional layers, for example, being arranged between the implied surface and the material layer.

Methods and apparatuses for carrying out methods of this type are described herein. Comments made in conjunction with a described method can also apply to a corresponding apparatus for carrying out the method and vice versa. If, for example, a specific step of a method is described, a corresponding apparatus for carrying out the method can comprise a suitable component for carrying out the step, even if a component of this type is not explicitly described or shown in the figures. Moreover, the features of the exemplary aspects described herein can be combined as desired with one another.

The versions selected herein of described methods do not necessarily have to imply a defined time sequence of the steps which are included in the methods. Instead, specified method steps can be carried out in any desired sequence if this is technically possible and appears to be technically appropriate. Moreover, one or more method steps can be carried out at least partially at the same time or during an identical time interval.

In the methods described herein, a multicomponent system and/or a multicomponent adhesive can be used. The comments made in the following text with regard to multicomponent adhesives can also be applied to multicomponent systems and vice versa. In this context, the expressions "multicomponent system" and "multicomponent adhesive" can be used exchangeably in this description. A multicomponent adhesive can be considered to be a multicomponent system with adhesive properties. Conversely, a multicomponent system does not necessarily have to have adhesive properties, but rather can also be used, for example, as a non-adhesive coating material.

Multicomponent adhesives can be configured by way of mixing at least two components which can react chemically with one another. A chemical reaction of this type can comprise, for example, crosslinking of polymers which participate in the reaction to produce acrylic, urethane, epoxy, etc. Exemplary combinations of multicomponent adhesives are: polyester resin and polyurethane resin, polyols and polyurethane resin, acrylic polymers and polyurethane resin, etc. The individual components of a multicomponent adhesive do not necessarily themselves have to have adhesive properties, but rather can react with one another after being mixed, it being possible for the adhesive action to become apparent only after curing of the mixture. One exemplary application of a multicomponent adhesive can comprise the following steps: applying of the individual components of the multicomponent adhesive, mixing of the individual components, curing of the mixed components.

One example of a multicomponent adhesive or multicomponent system is a two-component adhesive or two-component system. This can be an adhesive which consists of two different components, for example a resin and a curing agent. Curing can already begin at room temperature as a result of mixing of the two components before desired application of the two-component adhesive. In general, the curing reaction can be performed at room temperature and also at higher temperatures. In the methods described herein, curing of a mixture of the components of the multicomponent adhesive can take place at any desired temperature or perhaps any desired temperature interval within a range from about −20° C. to about 300° C., in particular within a range from about −20° C. to about 200° C., in particular within a range from about 0° C. to about 100° C., in particular within a range from about 15° C. to about 50° C. Two-component systems can cure, for example, by way of chemical reactions such as polyaddition, polycondensation and polymerization, etc. Examples of two-component adhesives are: unsaturated polyester resins, epoxy resins, methyl methacrylate adhesive, fibrin adhesive, etc.

One example of a two-component adhesive is a two-component epoxy resin adhesive which is made from a resin and a curing agent. For example, polymer building blocks with epoxy groups at their end (or synthetic resins which carry epoxy groups) can be used as epoxy resin. Here, they can be curable reaction resins which can be converted with a curing agent and optionally with additives, for example, to form a thermosetting plastic. The epoxy resins can be polyethers with two terminal epoxy groups. The curing agents can be reactants and can form a macromolecular plastic with the resin. In one example, the resin can be or comprise a multi-epoxy and the curing agent can be or comprise a multi-amino system or multi-phenol system.

The use of multicomponent adhesives or two-component adhesives can differ from the use of single-component adhesives. For example, there can be a difference in the curing of the systems. In a single-component system, the curing can take place by way of two possible mechanisms. Firstly by way of a chemical reaction with the surroundings (water vapor, etc.), secondly by way of an activation (UV radiation, IR radiation, heating, etc.). Two-component systems can afford the advantage that, after mixing of the two components, no further influence (water vapor, UV radiation, etc.) has to be necessary and the adhesive can cure automatically. It can be a further advantage here that by-products which have to be removed from the system do not necessarily have to form during curing in the case of two-component adhesives.

General exemplary applications of a multicomponent adhesive are coating or encapsulating of an electronic component or semiconductor component with the multicomponent adhesive, coating of a semiconductor wafer with the multicomponent adhesive, adhesively bonding objects together by way of the multicomponent adhesive, etc.

In one specific example, the epoxy resins which are mentioned can be used as a molding compound or a sealing compound for covering or housing electronic components or semiconductor components in electrical engineering or electronics. Here, apparatuses which are produced by way of the methods described herein can have one or more semiconductor chips which can be of different types and can be manufactured by way of different technologies. For example, the semiconductor chips can comprise integrated electrical, electro-optical or electromechanical circuits, active components, passive components, etc. The integrated circuits can be designed as integrated logic circuits, integrated analog circuits, integrated mixed signal circuits, integrated power circuits, memory circuits, integrated passive components, micro-electromechanical systems, etc. The semiconductor chips do not need to be manufactured from a defined semiconductor material, such as Si, SiC, SiGe or GaAs, and can contain, furthermore, inorganic and/or organic materials which are not semiconductors, such as non-conductors, plastics or metals.

In a further specific example, semiconductor wafers can be covered by components of a multicomponent adhesive. For example, a polyimide layer can be deposited on a semiconductor wafer according to one of the methods described herein.

The methods described herein can comprise an inkjet process. An inkjet process can be a printing process, in which a material to be deposited or to be printed can be applied in liquid form in a droplet-shaped manner onto a surface to be printed by way of nozzles of one or more print heads. A droplet of the material to be deposited can be produced and can be fed directly in an airborne manner to the surface to be printed.

In one example, in an inkjet process, the material to be deposited can be pressurized by way of a diaphragm pump and can flow from a mixing tank to one or more nozzles in a print head. Via ultrasonic oscillations, the pressurized material flow can be converted into droplets which can subsequently be ejected through the one or more nozzles. Here, the droplets can run through a charging electrode, can be charged there and can then be guided between deflecting electrodes. The droplets can be deflected electrically between the deflecting electrodes, it being possible for a magnitude of the deflection to be effected in accordance with the charge of the droplets. The said charge can be predefined by way of the charging electrodes. After the droplets have left the region of the deflecting electrode, the droplets can change their direction depending on the deflection which has taken place, until they can strike the object to be printed. In one example, in an inkjet process, a droplet of the material to be deposited can be produced, in particular, only when the droplet is also actually required for printing. If a droplet is requested, it is initiated according to various methods and is sprayed onto the surface to be printed.

In order to carry out an inkjet process, an apparatus which is designed for this purpose can be used, for example an inkjet printer which can comprise one or more print heads. In one example, the printer can comprise a single print head and can be called a single-head printer. In a further example, the printer can comprise at least two print heads and can be called a dual head printer or a multi-head printer. The print heads can correspondingly be called a dual print head or multi-print head, and the entire system can be called a dual print head inkjet system or a multi-print head inkjet system.

Each print head of a system of this type can be connected to in each case one reservoir, in which a material to be deposited or to be printed can be contained. That is to say, in the case of a plurality of print heads, a plurality of materials to be printed can be present separately from one another in separate reservoirs. Here, the number of print heads can correspond to the number of materials to be printed or to an integral multiple thereof. For example, in order to print a two-component adhesive, a dual print head inkjet system can be used, comprising a first reservoir with a first component of the two-component adhesive and a second reservoir with a second component of the two-component adhesive. The first reservoir can be connected to a first print head of the system and the second reservoir can be connected to a second print head of the system.

Each print head can comprise a multiplicity of nozzles, from which a material to be deposited can emerge during printing operation. A number of nozzles per print head can lie, for example, in a range from about 100 to about 600. In one example, the number of nozzles can be 128 or an integral multiple thereof, in particular 512. In a further example, the number of nozzles can also be smaller than 100.

A chamber or printing chamber can be arranged upstream of a nozzle of a print head, in which chamber or printing chamber droplets of a material to be printed can be produced. The volume of a chamber of this type can lie, for example, in a range from about 10 picolitres to about 80 picolitres. In one example, a small metal plate can be situated in a chamber of this type, which small metal plate can be heated in a short time to a temperature at which the material to be printed evaporates, as a result of which a vapor bubble can be produced. As a result of said vapor bubble, a droplet of the material to be printed is pressed through the nozzle and, after an airborne phase, can land on a surface to be printed. After the described operation, the vapor bubble can contract again, in order that new material to be printed can flow into the chamber. In a further example, a piezo-crystal can be situated upstream of the nozzle in a chamber of this type. The piezo-crystal can bring about a reduction in volume in the chamber, as a result of which the material to be printed can be pressed out of the nozzle. The material to be deposited can pass onto a surface to be printed, by the piezo-crystal pressing against a diaphragm, as a result of which the material to be printed can be pressed through the nozzle.

An apparatus for carrying out the methods described herein can comprise a control unit which is designed to control the components of the apparatus (print heads, nozzles, etc.). In one example, the control unit can comprise a microprocessor. Data required for actuating the apparatus components, information with respect to the material quantities to be deposited and target locations of the materials to be deposited, etc. can be stored, for example, in an electronic file or a print file.

In the methods described here, droplets of a material to be deposited can be deposited on a surface of an object. The surface of the object can have any desired shape and surface condition. If two different areas are to be brought into contact with one another after the depositing of the material, for example in order to fix the areas to one another, at least one of the areas can be of substantially planar configuration. The object to be printed can likewise have any desired shape and can be manufactured from any desired material. For example, the objects to be printed can be electronic components, semiconductor components, semiconductor wafers, mechanical components, workpieces, metal plates, plastic plates, tools, etc.

The geometric shape of a droplet which is deposited on the surface can depend, in particular, on the physical properties of the droplet material, for example its density, viscosity, composition, etc. In particular, the shape of the droplet can depend on the surface tension of its material and the adhesion between the droplet and the surface, on which the droplet has been deposited. At least part of the droplet surface can be delimited by the surface, whereas a further part of the droplet surface can remain non-delimited. The non-delimited portion of the droplet surface can be of substantially spherical configuration, it being possible for a diameter of the droplet to lie in a range from about 1 μm (micrometre) to about 1000 μm (micrometres), in particular from about 10 μm (micrometres) to about 200 μm (micrometres), in particular from about 10 μm (micrometres) to about 100 μm (micrometres), in particular from about 30 μm (micrometres) to about 120 μm (micrometres). If a droplet which is deposited on a surface no longer automatically changes its geometric shape, it has reached a state of equilibrium. The change in the droplet shape until the equilibrium is reached can be called spreading of the droplet. In the methods described herein, droplets which are deposited next to one another can spread further after being deposited and can run into one another in the case of a sufficiently small spacing between the droplets and can be mixed with one another as a result.

FIG. 1 shows a flow chart of an exemplary method with inkjet processes. The method which is shown can comprise additional steps, for example one or more steps of the methods likewise described herein. In a step 1, a first component of a multicomponent adhesive is deposited by means of an inkjet method or inkjet process. In a step 2, a second component of the multicomponent adhesive is deposited by means of an inkjet method or inkjet process.

The first and second component of the multicomponent adhesive can be deposited on any desired areas of any desired objects. Here, the two components can be deposited on an identical area or a plurality of different areas. Furthermore, the two components can be deposited using an identical inkjet process or using different inkjet processes. Steps 1 and 2 of the method can be carried out using any desired apparatuses which are suitable for this purpose. In one example, the first component can be deposited by way of a first print head of a dual print head and the second component can be deposited by way of a second print head of the dual print head. In a further example, the first component can be deposited by way of a single print head and the second component can be deposited byway of another single print head. Steps 1 and 2 of the method can be carried out one after another or at least partially at the same time.

Figure 2A:
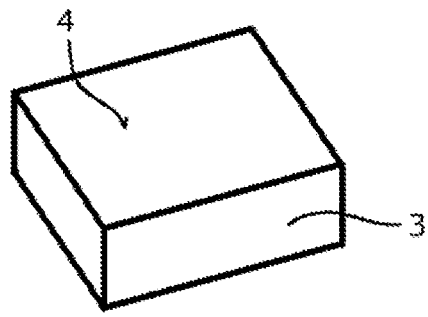
FIGS. 2A to 2C show a further exemplary method with inkjet processes.
Figure 2B:
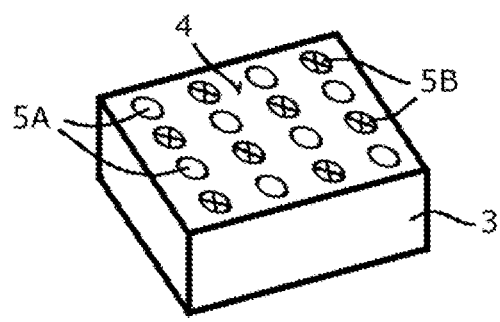
Figure 2C:
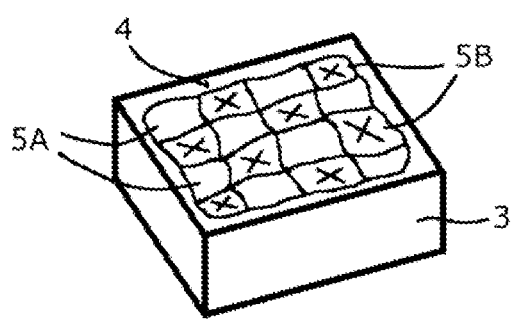

FIGS. 2A to 2C show a further exemplary method with inkjet processes. The method which is shown in FIGS. 2A to 2C can be considered to be an application of the method which is shown in FIGS. 1A and 1B. The details described in the following of the method of FIGS. 2A to 2C can therefore be applied likewise to the method of FIGS. 1A and 1B.

In FIG. 2A, an object 3 can be provided with a surface 4, on which components of a multicomponent adhesive, in particular a two-component adhesive, can be deposited in a later method step. The geometric form, selected in FIG. 2A, of the object 3 and the surface 4 is by way of example and is not to be considered to be restrictive. For example, the object 3 can be an electronic component, a semiconductor chip, a semiconductor wafer, a workpiece, etc. The surface 4 can have been machined by way of preceding method steps (not shown). For example, the nature of the surface 4 can have been changed into a desired form byway of a preceding method step (grinding, roughening, etc.).

In FIG. 2B, a first component 5A of a multicomponent adhesive and a second component 5B of the multicomponent adhesive can be deposited on the surface 4 of the object 3 by means of one or more inkjet processes. In particular, in one example, the first component 5A can be deposited by way of a first print head of a dual print head and the second component 5B can be deposited at the same time by way of a second print head of the dual print head. In FIG. 2B, the deposited droplets of the first component 5A are illustrated by way of circles and the deposited droplets of the second component 5B are illustrated by way of circles with crosses. The components 5A and 5B can of course also be deposited on one or more of the further surfaces of the object 3.

In the example of FIG. 2B, the droplets of the first component 5A and of the second component 5B are arranged in an array-shaped and alternating manner. Here, each droplet of the first component 5A can be directly adjacent in each case to at least one droplet of the second component 5B and vice versa. The arrangement of the droplets which is shown is by way of example, however, and is not restrictive in any way. In further examples, the droplets of the two components 5A and 5B can be arranged in any desired other patterns, for example in the form of lines, accumulations of a plurality of droplets of any desired geometry, etc. In particular, the arrangements can be configured here in such a way that at least part of the droplets of one component are adjacent to at least part of the deposited droplets of the other component, with the result that droplets of different components can be mixed by way of spreading of the droplets in the case of a suitable droplet spacing.

In FIG. 2B, the droplets of the first component 5A and of the second component 5B are initially present such that they are at least partially separated from one another spatially after being deposited. In one example, this spatial separation can also exist after spreading of the droplets. To this end, the two components 5A and 5B can be deposited on the surface 4 in such a way that the spacings between the applied droplets are selected at least partially in such a way that the droplets are not mixed on account of spreading of the droplets. Mixing of the two components 5A and 5B can then be brought about in a later step, for example byway of the surface 4 making contact with a further surface (not shown). In a further example, the spacings between the deposited droplets can be selected at least partially in such a way that the droplets can mix as a result of spreading of the droplets or the droplets run into one another. In a case of this type, curing of the mixed components to form the multicomponent adhesive can begin without steps which are to be performed additionally.

The selected size of the deposited droplets can depend on the individual application of the described method. The individual droplets of the first component 5A can have a substantially identical size or different sizes. The same applies to the droplets of the second component 5B. The diameter of the droplets of the first component 5A and/or the second component 5B can lie in a range from about 10 µm (micrometres) to about 200 µm (micrometres), in particular from about 10 µm (micrometres) to about 100 µm (micrometres), in particular from about 30 µm (micrometres) to about 120 µm (micrometres). A maximum spacing between the droplets of the first component 5A and/or the second component 5B can lie in a range from about 1% of the diameter to about 50% of the diameter of the droplets, in particular in a range from about 1% of the diameter to about 30% of the diameter of the droplets, in particular in a range from about 2% of the diameter to about 8% of the diameter of the droplets.

In further examples, further materials can also be deposited on the surface 4 by means of the described inkjet processes in addition to the first component 5A and the second component 5B. For example, fillers can be selected for this purpose, in order to adapt defined thermal properties, mechanical properties, thermomechanical properties, etc. of the mixed multicomponent adhesive at defined positions on the surface 4.

FIG. 2C shows the components 5A and 5B of the multicomponent adhesive applied onto the surface 4 in an at least partially mixed state. In one example, mixing of the components 5A and 5B can be brought about byway of spreading or a diffusion or running into one another of the droplets of the components 5A and 5B. In a further example, mixing can be brought about by way of mechanical action on the droplets of the components 5A and 5B. In a further example, mixing can be brought about by way of the surface 4 coming into contact or being pressed together with a further surface (not shown). In the example of FIG. 2C, the components 5A and 5B are not completely or not yet completely mixed. In particular, incomplete mixing of the components can indicate the use of an inkjet process. Here, the droplet-shaped composition change which is associated with the inkjet process can lie in an order of magnitude which can be analyzed by way of SEM (scanning electron microscope) methods or spatial resolution methods (infrared, Raman, mass spectroscopy, etc.). In a further example, the mixing of the components can be complete, with the result that a homogeneous mixture can be present after mixing. Curing of the mixed multicomponent adhesive can begin at the locations at which the components of the multicomponent adhesive are already mixed.

The method of FIGS. 2A to 2C can comprise further steps which are not shown explicitly for the sake of simplicity. In a further exemplary step, the mixed components 5A and 5B of the multicomponent adhesive can cure. For example, the object 4 can be a semiconductor chip which is to be encapsulated at least partially by the multicomponent adhesive. Here, the multicomponent adhesive can be, in particular, a molding compound which comprises an epoxy resin and can protect the semiconductor chip after curing against external influences, such as moisture, mechanical shocks, etc. In a further exemplary step, the surface 4 with the mixed components 5A and 5B arranged thereon can be brought into contact or pressed together with a further surface (not shown). Components of a multicomponent adhesive which have been treated according to FIGS. 2A to 2C or in a similar manner can likewise be arranged on the further surface. After curing of the mixed components 5A and 5B, the surfaces can be fixed to one another byway of the cured multicomponent adhesive. The objects can be, for example, components to be connected, metal plates, etc.

FIGS. 3A to 3D show a further exemplary method with inkjet processes. The method of FIGS. 3A to 3D can be considered to be a modification of the method of FIGS. 1A and 1B. The details described in the following text of the method of FIGS. 3A to 3D can be applied to the method of FIGS. 1A and 1B. Furthermore, the method of FIGS. 3A to 3D can be at least partially similar to the further methods described herein.

Figure 3A:
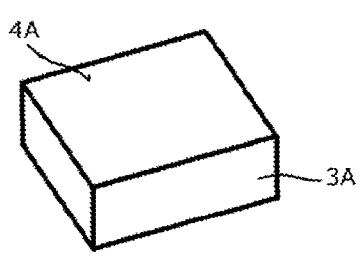
FIGS. 3A to 3D show a further exemplary method with inkjet processes.
Figure 3A:
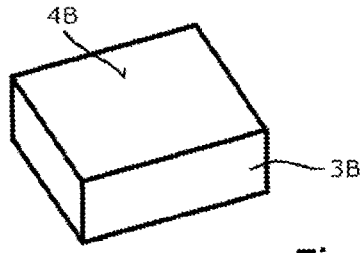

In FIG. 3A, a first object 3A with a first surface 4A and a second object 3B with a second surface 4B can be provided. The objects 3A and 3B can be objects of similar or different geometric shape, nature, composition, etc. Components of a multicomponent adhesive, in particular a two-component adhesive, can be deposited on the surfaces 4A and 4B in a later method step. In one example, the objects 3A and 3B can be workpieces which are to be fixed to one another by way of a multicomponent adhesive.

Figure 3B:
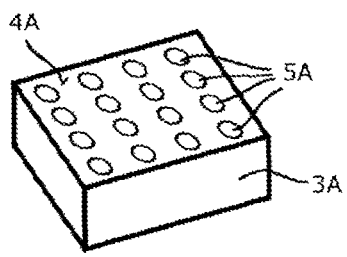
Figure 3B:
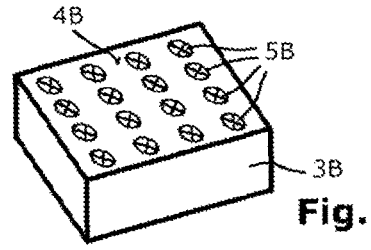

In FIG. 3B, a first component 5A of a multicomponent adhesive can be deposited on the first surface 4A by means of a first inkjet process. In a similar way, a second component 5B of the multicomponent adhesive can be deposited on the second surface 4B by means of a second inkjet process. The first and second inkjet process can be selected to be identical or different. In one example, the first component 5A can be deposited by way of a first print head of a dual print head, whereas the second component 5B can be deposited by way of a second print head of the dual print head. In a further example, the first component 5A and the second component 5B can be deposited by way of single print heads of different apparatuses. The two components 5A and 5B can be deposited on the surfaces 5A and 5B one after another or at least partially at the same time.

In the example of FIG. 3B, the droplets of the components 5A and 5B are arranged in each case in a regular manner in the form of an array. The selected version is by way of example and is not to be considered to be restrictive. In further examples, the droplets of the two components 5A and 5B can be arranged in other patterns, in an irregular manner or in a random manner. Furthermore, additional components, such as the abovementioned fillers, can be deposited on the surfaces 4A and/or 4B by way of further steps, for example in the form of further inkjet processes. Comments made in conjunction with FIG. 2B with regard to the properties, arrangement, etc. of deposited droplets can also be valid for FIG. 3B.

Figure 3C:
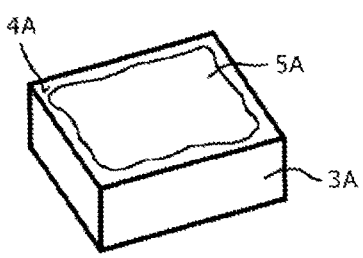
Figure 3C:
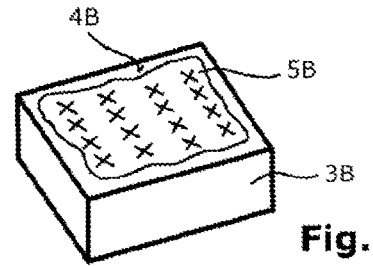

FIG. 3C shows the components 5A and 5B applied on the surfaces 4A and 4B in an at least partially mixed state. Mixing of the respective component 5A and/or 5B can be brought about, for example, according to one or more of the processes mentioned in conjunction with FIG. 2C.

Figure 3D:
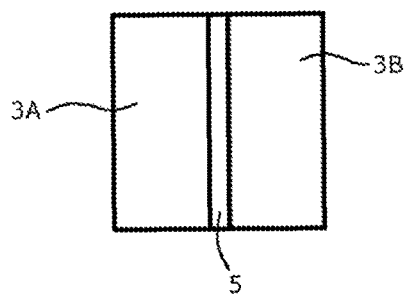

In FIG. 3D, the objects 3A and 3B on the surfaces 4A and 4B can be brought into contact or pressed together. Here, mixing of the components 5A and 5B and any additional materials can take place and curing of the mixed components 5A and 5B can begin. After curing of the components 5A and 5B, the objects 4A and 4B can be fixed to one another by way of the cured multicomponent adhesive 5.

The methods and apparatuses described herein can have the following properties and bring about the following effects. The list of properties and effects is to be considered to be neither exhaustive nor restrictive.

In an application of the methods described herein, the individual components of a multicomponent adhesive do not necessarily have to be premixed and/or deposited jointly on relevant areas. Pre-mixing of the components and their common application can have the disadvantage that firstly there has to be satisfactory mixing of the adhesive (for example, by way of pronounced stirring), and secondly a curing process of the mixed components begins as soon as the adhesive is mixed and therefore further processing (application, adhesive bonding, etc.) has to take place rapidly or adhesives which cure very slowly have to be used, which can result in an extended adhesive bonding process. The problem of premature curing can be avoided by way of the methods described herein, since the two components are mixed only when the curing process is desired. As a consequence, pre-mixing of the components is not necessary, and there does not necessarily have to be a limited processing time window. Fast curing multicomponent adhesives can therefore also be used in the methods described herein.

In examples of the methods described herein, additional steps for mixing of the involved components of the multicomponent adhesive are not necessarily required. Mixing can rather take place automatically, for example byway of spreading and running into one another of deposited droplets.

In the methods described herein, the individual components of the multicomponent adhesive do not necessarily have to be applied to in each case one of two relevant surfaces. During the application of in each case one component on one surface, mixing of the components can be brought about, in particular, as late as by way of a connection of the relevant surfaces. This can have the disadvantage that firstly the relevant surfaces have to be wetted separately with the respective component, which can signify an increased expenditure. In addition, accurate setting of relatively complex compositions (for example ratio 3:1) can be made more difficult. In addition, mixing of the individual components can take place in an impaired manner, and the adhesive can cure more rapidly from the middle of the adhesive layer, since the first contact of the components takes place there. In contrast, the mixing of the components can be poorest directly at the surfaces, although homogeneous curing by way of the formation of a strong, stable adhesive layer can be desirable precisely there. In other words, in the methods described herein, mixing can be brought about parallel to the surfaces to be adhesively bonded. As a result, both surfaces are covered with both components at the same time after pressing together of the adhesive areas, and curing takes place homogeneously over the entire contact area of the surfaces.

On account of a possible application of individual droplets of the components in the picolitre range, simple and accurate setting of a mixing ratio of the components of the multicomponent adhesive which are used can be performed in the methods described herein.

As a result of application of individual droplets of the components in the picolitre range, a resolution and structure of the deposited components can be improved in comparison with other methods. Furthermore, undesired inhomogeneities in the deposited structures can be avoided.

In the methods described herein, a structured adhesive application or structured printed image can be made possible. In particular, desired structuring can be adapted rapidly and simply via a printing program which is used or a print file which is used.

In the methods described herein, the components of the multicomponent adhesive which is used do not necessarily have to be transparent, as can be necessary, for example, for UV-curing adhesives.

In the methods described herein, the plurality of components of the multicomponent adhesive can be applied to an identical surface in a single process step, for example by way of the possible use of a dual print head system, which can have a time advantage in comparison with other methods.

Even if a certain feature or a certain aspect of the disclosure might have been disclosed with reference to only one of several implementations, this feature or this aspect can be additionally combined with one or more other features or aspects of the other implementations, as might be advantageous and desired for a given or specific application. Furthermore, to the extent that the expressions "include", "have", "with" or other variants thereof are used either in the detailed description or the claims, these expressions are to be understood to be inclusive in a similar way to the expression "comprise". The expression "exemplary" is also meant merely to be an example instead of being the best or optimum possibility. It is also to be understood that features and/or elements which are shown here are shown using defined dimensions in relation to one another for the purposes of simplicity and simple understanding, and that the actual dimensions can differ from those shown here.

Even if specific embodiments have been explained and described here, a person skilled in the art will understand that a multiplicity of alternative and/or equivalent implementations can replace the specific aspects which are shown and described, without deviating from the concept of the disclosure. This application is intended to cover any adaptations or variations of the specific aspects disclosed here. It is therefore intended that this disclosure is restricted only by the claims and equivalent refinements thereof.

What is claimed is:

1. A method, comprising:
   depositing a first component of a multicomponent system on an electronic component by means of an inkjet process; and
   depositing a second component of the multicomponent system on an electronic component by means of an inkjet process,
   wherein the first component comprises a resin, the second component comprises a curing agent, and the multicomponent system comprises an epoxy resin,
   wherein the first component and the second component are deposited in each case in droplet form, and spacings between the deposited droplets are such that the droplets do not mix as a result of spreading of the droplets;
   wherein the first and second components have contacting surfaces.

2. The method of claim 1, wherein the first component is deposited with a first print head of a dual print head and the second component is deposited with a second print head of the dual print head.

3. The method of claim 1, wherein the first component and the second component are deposited at the same time.

4. The method of claim 1, wherein the first component and the second component are deposited onto an identical area.

5. The method of claim 1, wherein the first component and the second component are separated spatially from one another after being deposited.

6. The method of claim 1, wherein the first component is deposited onto a first area, the second component is deposited onto a second area, and the first area and the second area brought into contact, the first component and the second component.

7. The method of claim 1, wherein at least one of the first component and the second component is deposited in droplet form, and the diameter of the deposited droplets are in a range from 1 micrometer to 1000 micrometers.

8. The method of claim 1, wherein at least one of the first component and the second component is deposited in the form of droplets with a diameter, and a maximum spacing between the deposited droplets is in a range from 1% of the diameter to 50% of the diameter.

9. The method of claim 1, further comprising:
   curing a mixture of the first component and second component at a temperature in a range from −20° C. to 300° C.

10. The method of claim 1, further comprising:
    coating or encapsulating semiconductor component with the multicomponent system.

11. The method of claim 1, further comprising:
    coating the electronic component having a semiconductor wafer with the multicomponent system.

12. The method of claim 1, further comprising:
    adhesively bonding two objects together by way of the multicomponent system.

13. The method of claim 1, further comprising:
    chemically reacting the first component with the second component to produce the multicomponent system.

14. The method of claim 1, wherein the multicomponent system comprises a multicomponent adhesive.

15. A method, comprising:
    depositing a first component of a multicomponent system on an electronic component by means of an inkjet process; and
    depositing a second component of the multicomponent system on an electronic component by means of an inkjet process,
    wherein the first component and the second component are deposited in each case in droplet form, and spacings between the deposited droplets are such that the droplets do not mix as a result of spreading of the droplets;
    wherein the first and second components have contacting surfaces.

* * * * *

UNITED STATES PATENT AND TRADEMARK OFFICE
CERTIFICATE OF CORRECTION

PATENT NO. : 9,818,602 B2
APPLICATION NO. : 14/861126
DATED : November 14, 2017
INVENTOR(S) : S. Schwab et al.

Page 1 of 1

It is certified that error appears in the above-identified patent and that said Letters Patent is hereby corrected as shown below:

On the Title Page

Item (73), please change "Infineon Technologies AG, Neubiberg (DE)" to – Infineon Technologies Austria AG, Villach (AT) –

Abstract, Line 1, please change "A method a described" to – A method as described –

Signed and Sealed this
Fifth Day of June, 2018

Andrei Iancu
*Director of the United States Patent and Trademark Office*